United States Patent [19]
Date et al.

[11] Patent Number: 5,144,563
[45] Date of Patent: Sep. 1, 1992

[54] METHOD AND APPARATUS FOR OPTIMIZING ELEMENT PLACEMENT AND METHOD AND APPARATUS FOR DECIDING THE OPTIMAL ELEMENT PLACEMENT

[75] Inventors: Hiroshi Date; Terumine Hayashi, both of Hitachi, Japan

[73] Assignee: Hitachi, Ltd., Tokyo, Japan

[21] Appl. No.: 492,906

[22] Filed: Mar. 13, 1990

[30] Foreign Application Priority Data

Mar. 16, 1989 [JP] Japan .................................. 1-62215

[51] Int. Cl.$^5$ ............................................. G06F 15/60
[52] U.S. Cl. ..................................... 364/491; 364/490; 364/489; 364/488; 395/800
[58] Field of Search ............... 364/488, 489, 490, 491, 364/131, 148; 395/800

[56] References Cited

U.S. PATENT DOCUMENTS

| | | | |
|---|---|---|---|
| 4,495,559 | 1/1985 | Gelatt, Jr. et al. | 364/491 |
| 4,577,276 | 3/1986 | Dunlop et al. | 364/491 |
| 4,630,219 | 12/1986 | DiGiacomo et al. | 364/491 |
| 4,686,629 | 8/1987 | Noto et al. | 364/491 |
| 4,754,408 | 6/1988 | Carpenter et al. | 364/491 |

FOREIGN PATENT DOCUMENTS

| | | |
|---|---|---|
| 93760 | 4/1987 | Japan . |
| 175869 | 8/1987 | Japan . |
| 219062 | 9/1987 | Japan . |
| 243071 | 10/1987 | Japan . |
| 121978 | 5/1988 | Japan . |

OTHER PUBLICATIONS

"A Placement Algorithm for Array Processors" by Chyan et al., IEEE 20th Design Automation Conf., 1983, pp. 182–188.

"A Parallel Processing Approach for Logic Module Placement" by Ueda et al., IEEE Trans. on Computer-Aided Design, vol. CAD-2, No. 1, Jan. 1983, pp. 39–47.

"Automatic Placement A Review of Current Technique" by Preas et al., IEEE 23rd Design Automation Conf., 1986, pp. 622–629.

"Placement by Simulated Annealing on a Multiprocessor" by Kravitz et al., IEEE Trans. on Computer-Aided Design, vol. CADp14 6, No. 4, Jul. 1987, pp. 534–549.

"A Class of Min–Cut Placement Algorithms" by Breuer et al. IEEE Proc. of 14th DAC, pp. 284–290 (1977).

*Primary Examiner*—Parshotham S. Lall
*Assistant Examiner*—V. N. Trans
*Attorney, Agent, or Firm*—Antonelli, Terry, Stout & Wands

[57] ABSTRACT

Element placement optimizing method and apparatus for determining an optimum placement of constituent elements for an LSI or the like. A parallel processing type computer system including a plurality of CPUs is used. An initial element placement is established and a number of paired element candidates for position exchange are selected from the initial placement, the number being equal to that of CPUS. A cost improvement value resulting from the exchange is determined for each of the paired candidates by the associated CPU. The exchange of the elements is performed for the paired element candidates for which the cost improvement value is maximum of those determined by the CPUs. By repeating the exchange, an optimum element placement is determined.

8 Claims, 11 Drawing Sheets

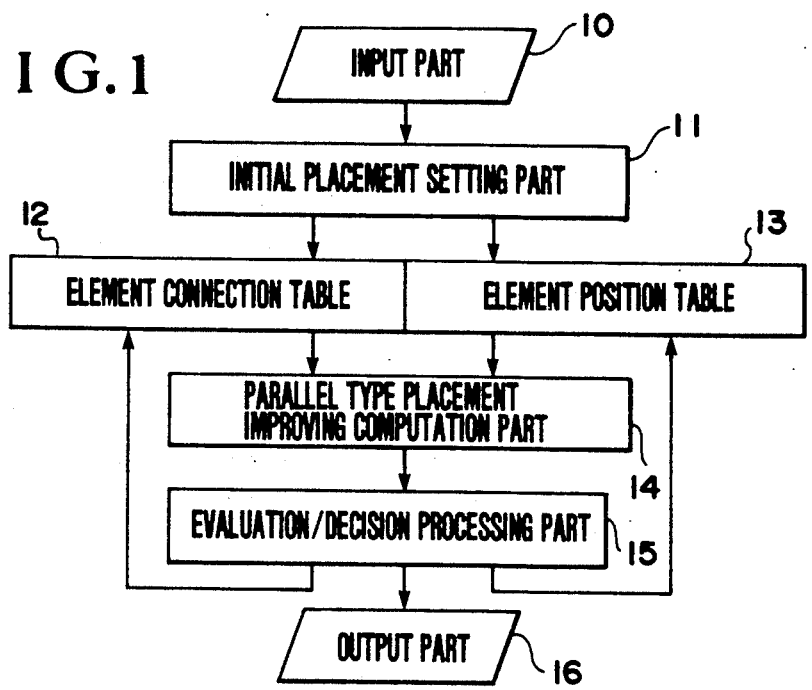
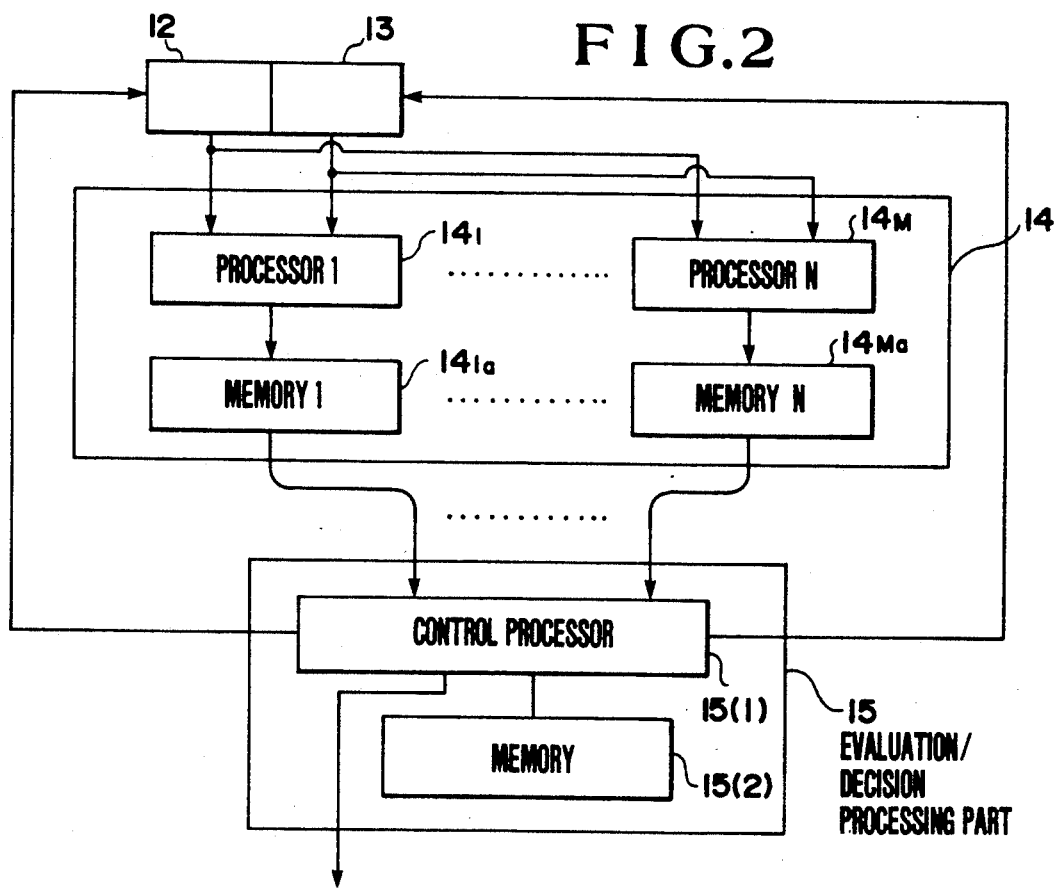

FIG.3

| NUMBER OF ELEMENTS (S) | ELEMENT NO.1 | NUMBER OF CONNECTED ELEMENTS (P₁) | CONNECTED ELEMENT NO.(q1(1)) | --- | CONNECTED ELEMENT NO.(q1(P1)) |
|---|---|---|---|---|---|
| | ELEMENT NO.2 | NUMBER OF CONNECTED ELEMENTS (P2) | CONNECTED ELEMENT NO.(q2(1)) | --- | CONNECTED ELEMENT NO.(q2(P2)) |
| | ⋮ | | | | |
| | ELEMENT NO.S | NUMBER OF CONNECTED ELEMENTS (Ps) | CONNECTED ELEMENT NO.(qs(1)) | --- | CONNECTED ELEMENT NO.(qs(P3)) |

| NUMBER OF ELEMENTS (S) | ELEMENT NO.1 | X-COORDINATE (X1) | Y-COORDINATE (Y1) |
|---|---|---|---|
| | ELEMENT NO.2 | X-COORDINATE (X2) | Y-COORDINATE (Y2) |
| | ⋮ | | |
| | ELEMENT NO.S | X-COORDINATE (XN) | Y-COORDINATE (YN) |

(211, 213, 214, 215, 212, 216)

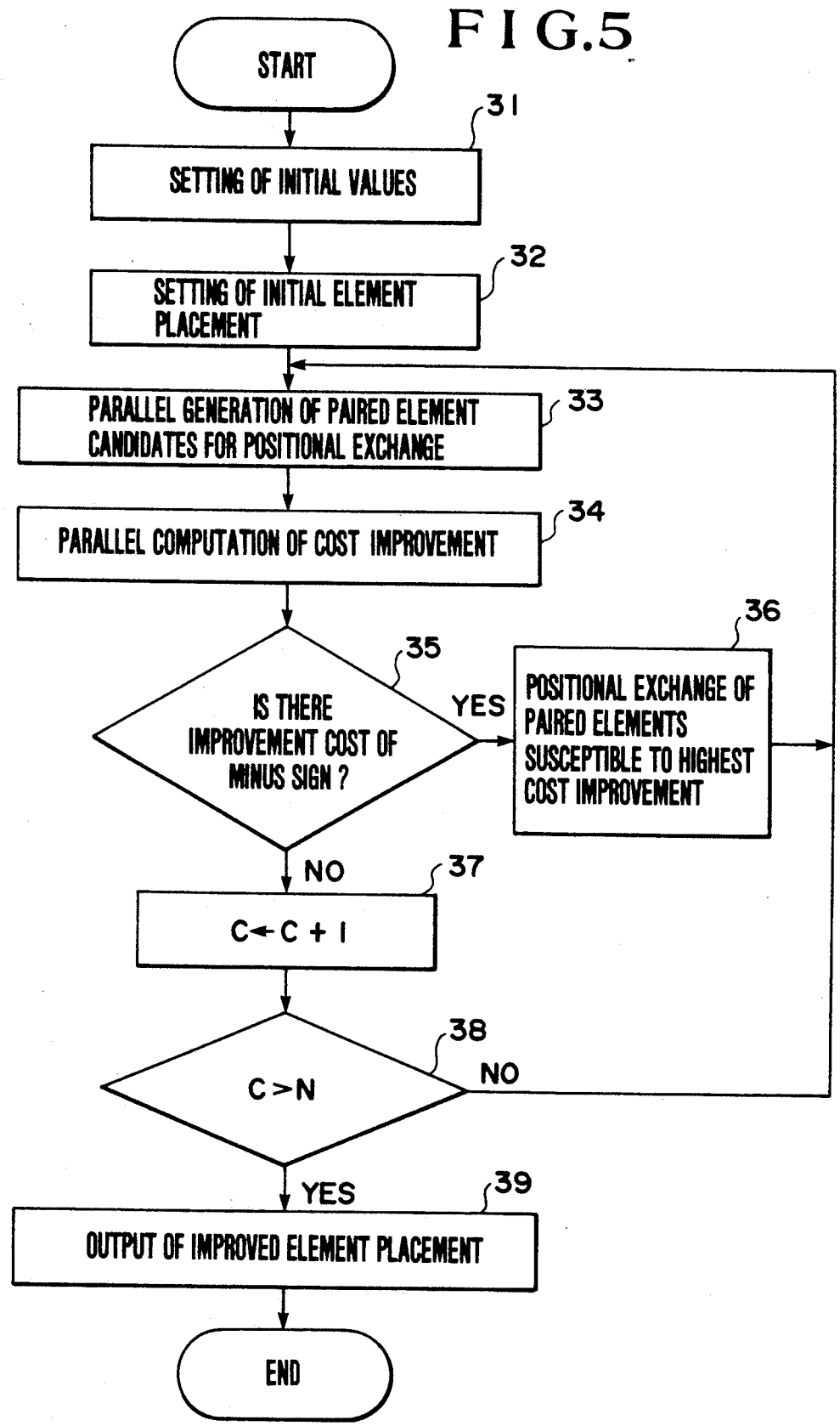

METHOD AND APPARATUS FOR OPTIMIZING ELEMENT PLACEMENT AND METHOD AND APPARATUS FOR DECIDING THE OPTIMAL ELEMENT PLACEMENT

BACKGROUND OF THE INVENTION

The present invention relates to element placement optimization method and apparatus for determining an optimal placement of constituent elements such as LSIs. More particularly, the present invention is concerned with an element placement optimizing method and apparatus suited profitably for determining efficiently an optimal placement of the LSI constituent elements or the like within a reduced time as well as a method and apparatus for making decision as to the optimal placement.

In integrated circuits such as LSIs and others, a plurality of individual elements disposed on a chip are mutually interconnected by wiring conductors or lines. In this connection, it is noted that the overall line length in a LSI becomes significantly different when the positions of constituent elements placed in a matrix array, for example, are exchanged. Accordingly, for designing the integrated circuits, there is a need for optimizing the placement of the individual constituent elements so that the wiring length is shortened as far as practically possible. This in return reduces the cost involved in the manufacture of the integrated circuits. There have been developed a variety of design automation techniques for determining the optimal element placement for LSIs and others with the aid of a computer.

FIG. 13 of the accompanying drawings shows a flow chart for illustrating a related art element placement optimizing method which is sometimes referred to as the repetitive improvement method. This known repetitive improvement method is carried out by a sequential processing type computer known. Referring to FIG. 13, the number N represents the number of times a placement improving operation is to be repeatedly executed and is set at step 21. The setting of initial locations for individual elements by using pseudo-random numbers is set at step 22. Next, two paired element candidates are selected randomly by using pseudo-random numbers at step 23. Then it is arithmetically determined to what extent the cost could be reduced on the assumption that the period element candidates were exchanged with each other in respect to the locations or positions thereof at step 24. Subsequently, at step 25, a decision is made whether any cost improvement could be achieved. If it is decided that the cost for the paired element candidates will be able to be improved, e.g. when a difference resulting from subtraction of the pre-exchange cost (i.e. the cost involved unless the exchange is not performed) from the post-exchange cost has a sign of minus (negative), the processing proceeds to step 26. At step 26, the paired elements are exchanged in respect to the locations thereof, whereupon processing reutrns to step 23. On the other hand, if it is decided at step 25 that no improvement can be achieved in the cost, the processing proceeds to step 27 where the content of a counter C is incremented by "1", which is followed by step 28 at which a decision is made whether the content of the counter C is greater than the number N set at step 21. When this decision in step 28 results in C being smaller than N, processing returns to step 23 whereupon the processing succeeding thereto is repeated in the manner described above. Otherwise, i.e. when C is greater than N, the placement improving processing described above is terminated, and the information about the improved element placement is outputted at step 29. Thus, the processing comes to an end.

In conjunction with the related art element placement improving method outlined above, reference may be made to JP-A-62-93760 (Japanese Patent Application Laid-Open No. 93670/1987) and JP-A-62-243071.

The related art placement optimizing methods mentioned above have been developed for the integrated circuits having a relatively small number of the constituent elements. Accordingly, when the method is applied to a LSI having a high integration density as in the case of modern LSIs, the number N of the repetition times is remarkably increased, giving rise to a problem that an enormous amount of time is taken for the computation. Notwithstanding such high expenditure accompanying the conventional technology method, it is still difficult to determine the optimal element placement. This in turn presents a problem in deciding whether a further improvement of the element placement is possible.

Of the problems mentioned above, that of the time taken for the computation may be solved by using a parallel processing type computer system. In this computer system paired candidates are allocated to a plurality of CPUs for allowing them to compute the cost improvements, respectively, as is disclosed in, for example, JP-A-62-219062 and JP-A-62-175869. In particular, JP-A-62-17589 discloses a processing system for deciding module placement in which each of the locations or blocks for the elements is assigned with a CPU, wherein each CPU determines destinations to which the associated elements are to be moved with the aid of a procedure referred to as a gravity fgrce directed relaxation method. The names of the element is then sent by message to the CPUs belonging to the destinations. However, in this method, it is still difficult to realize the optimal placement for the reasons mentioned previously.

Another method for realizing the optimal element placement involves a simulated annealing method in which those candidates for which the positional exchange brings about deterioration rather than the improvement are determined. In this conjunction, reference may be made to "Technical Research Report VOD88-6 of the The Institute of Electronic Information and Communication Engineers of Japan", pp. 4–48. It is reported that by adopting this simulated annealing method, there can be realized the placement approximating to the optimum. However, this method also suffers from a problem that an enormous amount of time is taken for the computation. As an attempt for solving this problem, JP-A-63-121978 has proposed a system in which the abovementioned multi-processor method is adopted for determining stochastically whether or not the individual CPUs should perform the position exchanges in accordance with the simulated annealing method.

According to the related art methods in which the multi-processor system is adopted, reduction in the time required for the computation is attempted simply by allocating the tasks to a plurality of CPUs, wherein the results of the computations performed by the CPUs are taken into account independently of one another. By way of example, assuming that the repetitive improvement method described hereinbefore in conjunction with FIG. 13 of the accompanying drawings is carried out with the aid of the multi-processor system, the positions of the paired elements, as selected, for which it has been determined through computation that the exchange brings about improvement in respect to the cost will all be changed. This means that a lot of time needs to be taken for converging the element placement to the optimum.

SUMMARY OF THE INVENTION

It is a first object of the present invention to provide an element placement optimization method which is capable of determining at a high speed the element placement coinciding with an optimum solution or approximating thereto as well as an apparatus for carrying out the method.

A second object of the present invention is to provide an optimal placement deciding method which is capable of deciding at a high speed whether or not the placement of elements is local optimal as well as an apparatus for carrying out the method.

In view of the first object, it is proposed that, according to a general aspect of the present invention that a plurality of paired element candidates are selected at random, and a value of cost improvement is computed for each of the element candidate pairs. Only the element candidate pair having the highest value of cost improvement or alternatively the element candidate pair having a higher value of cost improvement than a given threshold value is repeatedly subjected to the processing for exchanging the element positions for a predetermined number of times or until the effect of improvement can no more be shown.

In view of the second object mentioned above, it is proposed that, according to another general aspect of the present invention that a plurality of given pairs of the positioned elements are selected at random, the value of cost improvement is computed for each of the pairs, the positions for any given one of the pairs where effect of cost improvement is found is decided not to be local optimal for the element placement, and that the placement where the pairs improved in cost has not been selected even after a predetermined number of repetitions of the above processing is decided to be a local optimal placement.

In the apparatuses for achieving the first and second objects of the invention, there is preferably adopted a multi-processor system.

In the case of the element placement optimizing method and apparatus according to the invention in which the multi-processor system is adopted, convergence to the optimal solution can be accomplished at an increased speed. This is because the element placement is changed only for the pair in which the highest cost improvement or a higher cost improvement than a threshold value is expected from the results of the computations performed by the individual CPUs.

In the optimal arrangement deciding method and apparatus according to the invention, a decision whether or not an element placement is the optimal solution can be made, at an increased speed. This feature allows the placement for a plurality of pairs of the elements selected at random and are not improved in the cost to be decided as to be a local optimal solution.

The present invention can enjoy such advantageous effect that the element placement in the large size LSI and others can be optimized at a very high speed. Additionally, the use of the element placement optimizing method and apparatus is accompanied with a profitable effect that the LSI or the like having an enhanced quality can be realized. Besides, application of a parallel processing type computer to the realization of the invention enables the processing to be further promoted with overhead being reduced.

Further, with the optimal placement deciding method and apparatus according to the present invention, it is possible to decide at a higher speed whether or not any given element placement is local optimal.

BRIEF DESCRIPTION OF THE DRAWINGS

These and other objects and advantages of the present invention will become apparent by reading the following description of preferred or exemplary embodiment taken in conjunction with the accompanying drawings, in which:

FIG. 1 is a block diagram showing general placement of an element placement optimizing apparatus according to an exemplary embodiment of the present invention;

FIG. 2 is a block diagram showing in more detail a major portion of the apparatus shown in FIG. 2;

FIG. 3 is a view showing a structure of a connection table employed in the element placement optimizing apparatus shown in FIG. 1;

FIG. 4 is a view showing a structure of an element position table employed in the element placement optimizing apparatus shown in FIG. 1;

FIG. 5 is a flow chart for illustrating a computation procedure for the element placement optimizing method according to a first embodiment of the invention;

DESCRIPTION OF THE PREFERRED EMBODIMENT

Figure 6:
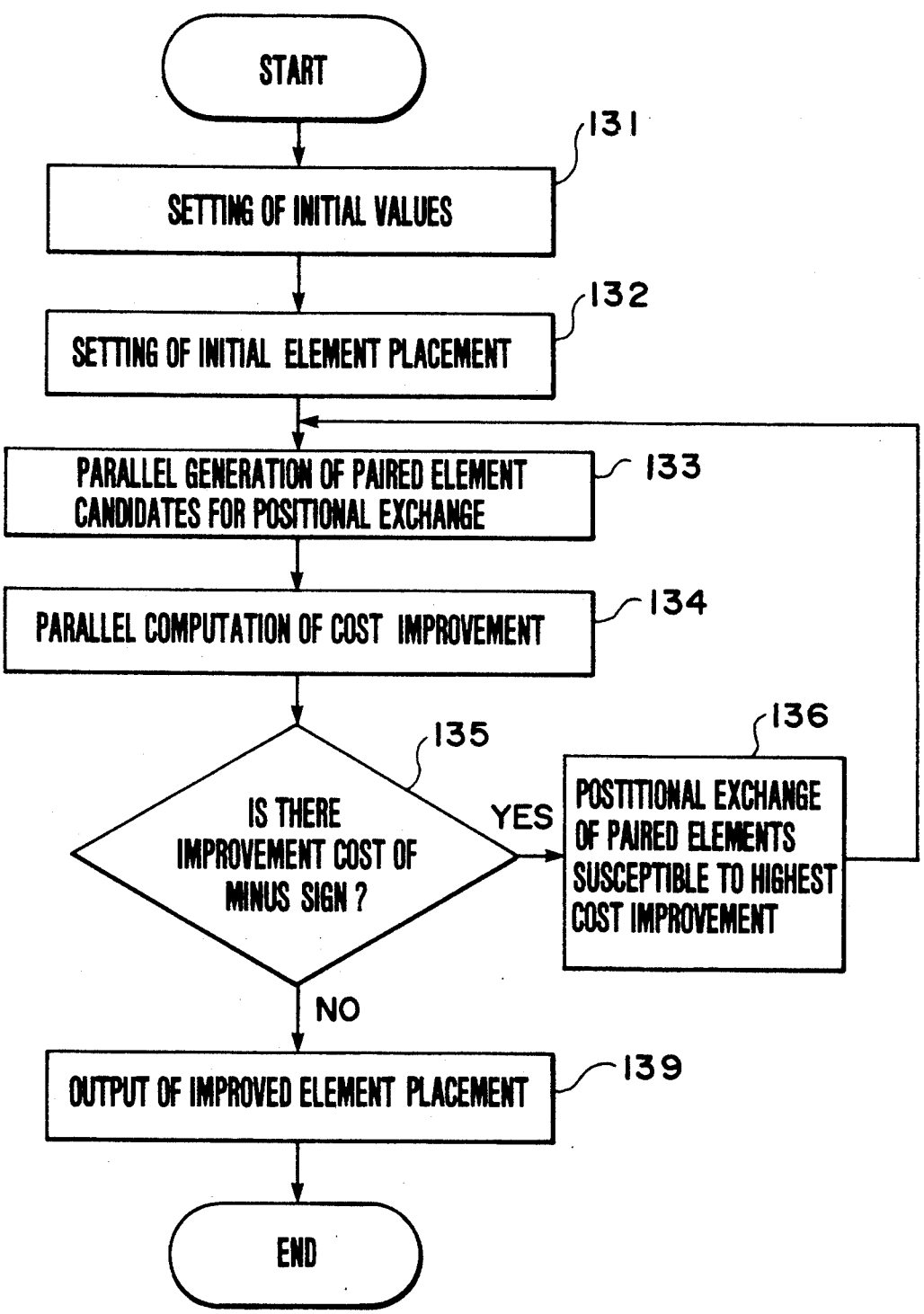
FIG. 6 is a flow chart for illustrating a computation procedure for the element placement optimizing method according to a second embodiment of the invention.

Now, the present invention will be described in detail in conjunction with exemplary or preferred embodiments by reference to the accompanying drawings.

FIG. 1 shows in a block diagram a general placement of the element placement optimizing apparatus according to an exemplary embodiment of the invention. In the following description, it is assumed that a parallel processing type computer system is employed. However, it should be appreciated that a sequential processing type computer can equally be used.

Preferring to FIG. 1, the element placement optimizing apparatus includes a condition setting input part 10, an initial placement setting part 11, a connection table 12 and an element position table 13 both stored in a storage or memory, a parallel-type placement improving computation part 14, an evaluation/decision part 15 and an output part 16.

The initial arrangement setting part 11 sets or establishes an initial placement of constituents or elements at random by using preudo-random numbers or through an empirical or heuristic procedure such as, for example, a minimum cut method mentioned hereinafter or the like in accordance with the conditions inputted through an input part 10.

The connection table 12 contains information about wiring or interconnecting relations among the elements. This table is initialized by the information supplied from the initial placement setting part 11.

The element position table 13 stores therein the information concerning the positional relationships among the individual elements. This table is initialized by the information supplied from the initial placement setting part 11 and updated by the information supplied from the evaluation/decision processing part 15. Both of the tables mentioned above is constituted by a shared memory in the case of the illustrated embodiment.

FIG. 3 shows a structure of the connection table 12 which is a sort of net list. The constituent elements incorporated in a number S in a LSI are attached with the identification numbers "1"to "S", respectively. The information about the connection of the element numbered 1 (No. 1) is stored as shown at 201 in the table 12, the information about the connection of the element No. 2 is stored as shown at 202, and so forth. In this manner, the information concerning the elements No. 1 to No. S is arrayed in S rows in parallel with one another. The number (S) of the elements is stored at a position 209 located adjacent to the information No. 1. As the contents of the information about the connection of the element No. 1, the element identification number (No. 1) is placed at a leadig or start position 203, while a number ($P_1$) of the elements to be connected to the element No. 1 is placed at a next position 204, in succession to which there are sequentially arrayed the identification numbers $q_1(1)$ to $q_1(P_1)$ of the elements to be connected to the element No. 1, as indicated at 205 in the table of FIG. 3.

FIG. 4 shows a structure of the element position table 13 containing the information about the positions of the elements, i.e. the coordinates of the individual elements. Information about the position of the element No. 1 is stored at 211. In this manner, the position information of the elements No. 1 to NO. S are arrayed in parallel in S rows, respectively. The number (S) of the elements is stored at a position 213 adjacent to the position information of the element No. 1. As the contents of the information 211 about the position of the element No. 1, the identification number (No. 1) of that element is placed at the start position 214 in succession to which the X-coordinate ($X_1$) and the Y-coordinate ($Y_1$) of the element No. 1 are placed at positions 214 and 216, respectively, in this sequential order.

The parallel processing type element placement improving computation part 14 comprises a plurality of processors 14(1), ..., 14(M) and memories 14(1a), ..., 14(Ma) provided in correspondence to the individual processors, respectively, as shown in detail in FIG. 2. Each of the processors 14(1), ..., 14(M) serves to select a pair of element candidates (also referred to as the paired element candidates) independent of the others by using pseudo-random numbers or the like, determine evaluation function values for evaluating the element placement before and after local change thereof (e.g. before and after exchange of the element position) by utilizing the data available from both the tables 12 and 13 mentioned above, compute the value of improvement in the cost (also referred to as the cost improvement value) which can be attained by carrying out the local change on the basis of both the evaluation function values, and store the cost improvement value and the paired element candidates in the associated one of the memories 14(1a), ..., 14(Ma).

The evaluation/decision processing part 15 comprises a control processor 15(1) (which may be constituted by one of the processors shown in 1 which assumes initially an idle state) and a memory 15($a$). The control processor 15(1) serves to determine the value indicating the most effective cost improvement from those computed by the individual processors incorporated in the parallel processing type placement improving computation part and stored in the respective memories, and update the associated values of the element position table 13 to the values representing the positions of the paired candidate elements which assume the determined value. When the result of the element placement optimizing calculation satisfies predetermined final conditions, as described in detail later on, the control processor 15(1) outputs through the output part (16) the information concerning the inter-element connection or wiring relations as well as the inter-element positional relations at that time point.

Operation for satisfying the predetermined final condition is performed by the control processor 15(1) through cooperation with the memory 15(a). To this end, there may be stored in the memory 15(a) the number (N) of times the element placement computation is to be repeated, the number (M) of the CPUs which are used for the computation processing or which is to be used upon starting the computation processing in case a number of the usable CPUs are variable, the number of the CPUs increased as the computation proceeds, the upper limit number of the CPUs which are allowed to be employed, and others. By implementing a counter with the memory 15($a$) and the control processor 15(1), the conditions for the number of times the element placement computation is to be repeatedly executed is established. Alternatively, a threshold value for the cost improvement is established by storing a predetermined cost improvement value in the memory 15($a$).

FIG. 5 is a flow chart for illustrating a computation procedure for carrying out the element placement optimizing method according to a first embodiment of the invention. First, initial values are set at step 31. In this initialization step, set the predetermined repetition number N (a positive integer or natural number) initialized to be used for deciding whether the whole processing is to be completed and the number M of the CPUs be initialized to be used for the aimed processing, and "1" is set as the initial value for the counter C.

Theoretically, the highest performance can be realized, when the CPU number M is set at the value determined in accordance with the following expression:

$$M = {}_sC_2 = S(S-1)/2$$

where S represents the number of elements to be placed, M represents the number of the CPUs, and C represents the number of combinations. The initial element placement is determined at random while the paired elements are also selected at random.

The predetermined value of the repetition number N is empirically determined. Assuming, by way of example only, that the number S of the elements is 50 (in practice, the number S of the elements arranged or placed on an actual LSI is approximately in the range of 50 to 100) and that the number of the CPUs is 1225, then the value of N should preferably be on the order of 60 (times).

At next step 32, the initial placement of the elements is established by using, for example, pseudorandom numbers. Such initial placement of the elements can be specifically determined by labelling the S elements with the respective identification numbers (Nos. 1 to S), as described previously in conjunction with the connection table (FIG. 3) and the element position table (FIG. 4), and by defining S slots numbered and arrayed for allowing the S elements to be disposed thereon by the X- and Y- coordinates, wherein the initial element placement is specified by the X-Y slot numbers. Thus, the initial element placement can be established by determining the identification numbers of the slots where the elements are placed, respectively, by using pseudo-random numbers and determining the placements of the elements.

At step 33, M pairs of the element candidates are selected at random by using pseudo-random numbers or the like, whereon the cost improvement value is computed by subtracting the cost required for the wiring or other after positional exchange of the paired elements from that required before such exchange (step 34). The computation to this end is performed as follows. In the first place, the overall inter-element wiring length E is determined in accordance with the following expression:

$$E = (1/2) \sum_{i=1}^{S} \sum^{P(i)} d(i, n(j))$$

where D(i, n(j)) represents the number of elements, and P(i) represents the number of elements the distance between an element i and an element n(j), S represents connected to the element i.

On the other hand, the cost improvement value ΔE resulting from the exchange of elements and b can be; determined in accordance with $$\Delta E = E_1 - E_2$$

where $E_1$ represents the cost value after the exchange, and $E_2$ represents the cost value before the exchange. The above computation is performed for every pair by the associated CPUs, respectively. However, it should be understood that the present invention is never limited to the abovementioned method of determining the cost improvement value but any other appropriate evaluation functions may equally be utilized within the scope of the invention. By way of example, there may be mentioned a minimum cut method according to which the cost improvement value is determined by taking advantage of the fact that the number of wiring conductors crossing a predetermined cut line is increased or decreased as a result of the positional exchange of elements (reference may be made to M.A. Brever : A class of Min-cut Placement Algorithm, Proc. of 14th DAC. pp. 284-290 (1977)).

Subsequently, at step 35, a decision is made as to whether or not there exists the cost improvement value of minus (negative) sign among those computed by the M CPUs (i.e. the value indicating cost reduction due to the positional exchange of the paired element candidates). If the answer of this decision step is affirmative (yes), the processing proceeds to step 36 where the positions of the paired elements involving the highest cost reduction are exchanged, whereby processing returns to step 33.

On the other hand, when the result of the decision step 35 is negative (no), the processing proceeds next to step 37 where the content of the counter C is incremented by "1", which is then followed by step 38 where the content of the counter C is compared with the predetermined repetition number N set at step 31. When the comparison processing step 38 results in that the condition C>N is not satisfied, the step 33 is regained. Otherwise the element placement information determined through the processing described above is outputted, and thereby the entire processing is completed. In other words, when M element pairs which can bring about the cost improvement have been selected (N+1) times, the whole processing is then completed.

According to the instant embodiment of the invention, there can be achieved an advantageous effect that the local optimal element placement can be determined at a high speed. Besides, when the parallel-processing type computer system is used (although a high-speed sequential processing computer can be used), the CPU overhead problem encountered in the conventional parallel processing is unlikely to occur by virtue of the feature that the individual CPUs are capable of computing the cost improvement values owing to the inter-element positional exchanges which are independent of one another.

FIG. 6 is a flow chart for illustrating the element placement optimizing method according to a second embodiment of the present invention. The instant embodiment is basically similar to the first embodiment. The steps 131, 132, 133, 134, 135, 136 and 139 shown in FIG. 6 correspond, respectively, to the steps 31, 32, 33, 34, 35, 36 and 39 of the first embodiment except for the difference mentioned below. In the case of the first embodiment, the computation for determining the cost improvement value for the element pairs is repeated for the predetermined number of times (N) through the processing steps 37 and 38. In contrast, according to the teaching incarnated in the instant (second) embodiment, the result of the optimal placement computation can be outputted by way of the improvement placement output step 139 from the decision step 135, when there no longer exists the cost improvement value of minus sign among the CPUs.

Figure 7:
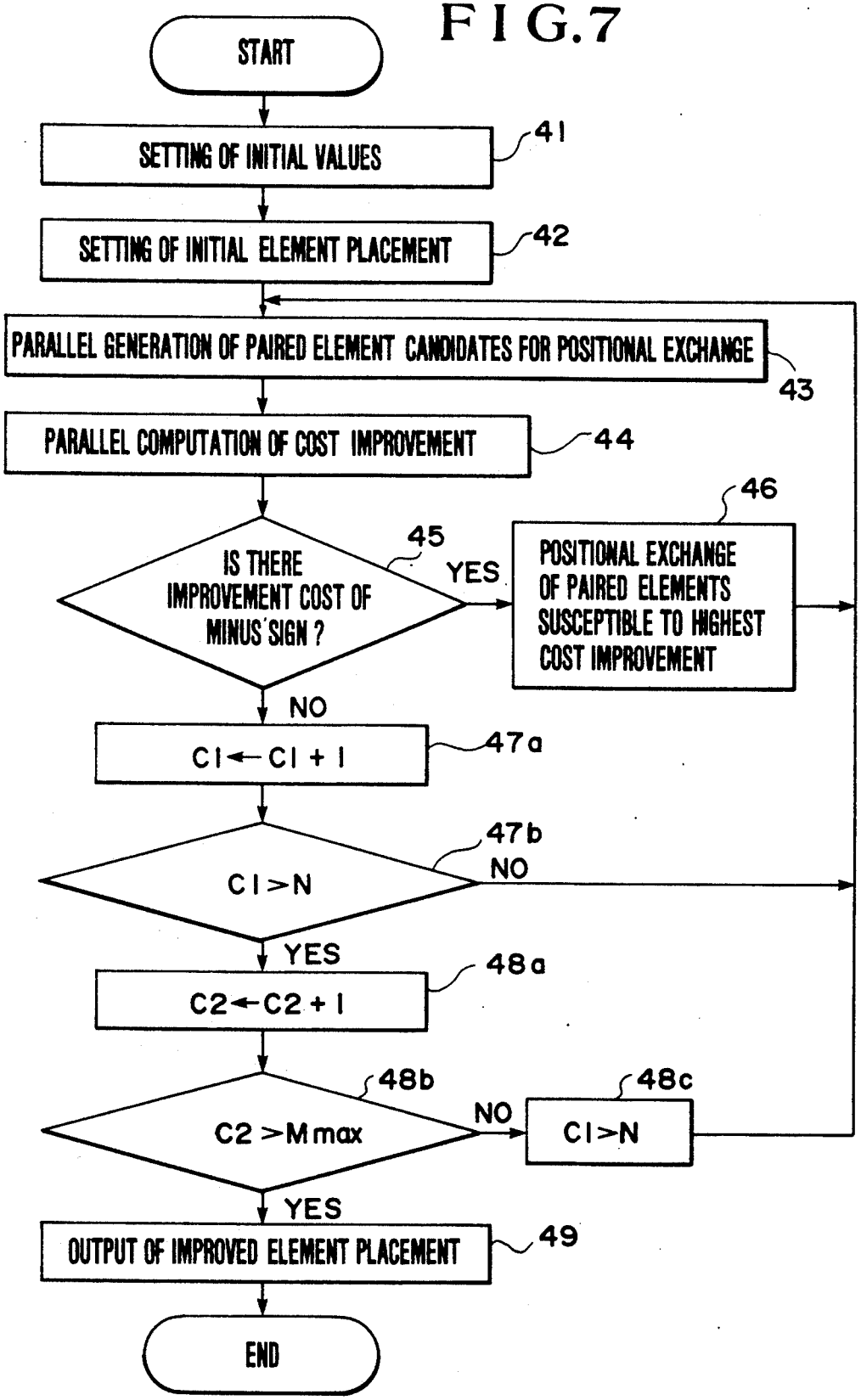
FIG. 7 is a flow chart for illustrating a computation procedure for the element placement optimizing method according to a third embodiment of the invention.

FIG. 7 is a flow chart for illustrating the element placement optimizing method according to a third embodiment of the present invention. This embodiment is basically similar to the first embodiment except that the use of a parallel processing type computer system is a prerequisite in order to allow other tasks to be executed in parallel with the optimal element placement determination processing.

Referring to FIG. 7, initial values are set at set 41. More specifically, a natural number N for deciding completion of the processing and an upper limit value $M_{max}$ of the number of the CPUs as employed are set with the initial values for two counters Cl and C2 being set to "1", respectively.

At a succeeding step 42, an initial element placement is set, as described hereinbefore in conjunction with the step 32 of the first embodiment.

At a next step 43, a number of the element candidate pairs equal to the number contained in the counter C2 are selected at random, whereon the cost improvement values are computed for the selected element candidate pairs (step 44). Then, decision is made as to whether any one of the computed improvement values has minus sign (step 45). If the answer of the decision step 45 is affirmative (yes), the positions of the paired candidate elements susceptible to the highest cost improving effect (i.e. maximum cost reduction) are exchanged to each other, and then the step 43 is regained. On the other hand, when the answer of the decision step 45 is negative (no), i.e. when no cost improvement value of minus sign is found, the processing proceeds to step 47a where the content of the counter Cl is incremented by "1". Subsequently, at step 47b, the content of the counter Cl is compared with the present value N which was initialized at step 41. If the condition Cl>N is not satisfied, processing returns to step 43, otherwise the processing proceeds to step 48a.

At step 48a, the content of the counter C2 is incremented by "138 . In step 48b, where the content of the counter C2 is compared with the upper limit value $M_{max}$. If the condition C2>$M_{max}$ at step 48b is not satisfied Cl>N is confirmed at step 48c, and thereafter processing returns to step 43. On the other hand, when the answer of the decision step 48b is affirmative (yes), the information of the element placement determined through the processing described above is outputted at step 49. The processing then comes to an end.

In brief, according to the teaching incarnated in the third embodiment of the element placement optimizing method, a first pair of elements is selected for determining the cost improvement value attainable with the positional exchange. In case the cost improvement is found possible, the element replacement is performed. This processing is repeatedly executed. When the element pair insusceptible to the cost improvement has been selected (N+1) times, then a second pair of the elements is selected to undergo the similar processing. When the element pair insusceptible to the cost improvement has been selected (N+1) times, then a third pair of the elements is selected to be subjected to the similar processing. In this manner, the number of the pairs to be selected is increased one by one (with the number of the CPUs for use in the parallel computation of the cost improvement value being correspondingly increased), and when the number of the CPUs exceeds the value $M_{max}$ preset at the step 41, the entire processing is completed. When the number of the CPUs operated actually is smaller than the upper limit number $M_{max}$ of the usable CPUs, the extra CPUs are used for executing other task(s).

The instant (third) embodiment of the invention can enjoy in addition to the advantageous effects similar to those of the first embodiment a further profitable effect that the processing for the optimal element placement determination may be executed in parallel with other task(s). It should be mentioned that instead of increasing the number of the CPUs one by one, it is also possible to increase it on a plural-number basis i.e. by a predetermined number of CPUs simultaneously). Besides, it is also conceivable that priority or preference is placed on the other task(s), wherein the CPUs in excess are used for computation of the cost improvement value. In that case, the processing for determining the optimal element placement may be completed when the element pair susceptible to the cost improvement can no more be selected even after the computation for the cost improvement has been performed for a predetermined number of times or even after it has been carried out a predetermined number of times by using a predetermined number of CPUs.

Figure 8:
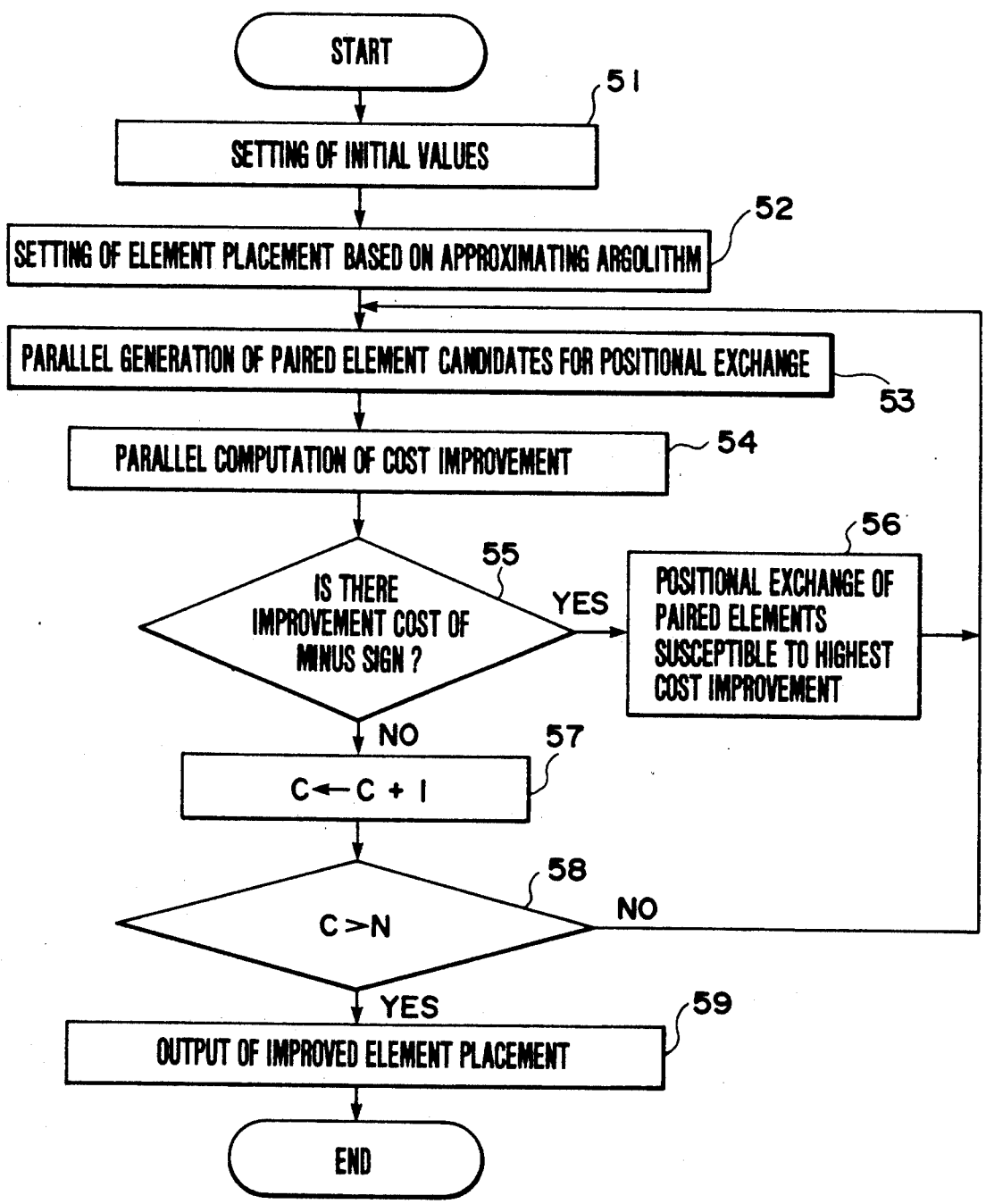
FIG. 8 is a flow chart for illustrating a computation procedure for the element placement optimizing method according to a fourth embodiment of the invention.

FIG. 8 is a flow chart for illustrating the computation procedure involved in the element placement optimizing procedure according to a fourth exemplary embodiment of the present invention. This embodiment differs from the first embodiment only in that the setting of the initial element placement performed at the step 32 is carried out at random but in accordance with an approximating algorithm. With the setting in accordance with the approximating algorithm, it is intended to mean the setting through empirical or heuristic procedure which is capable of setting the element placement so as to reduce the cost to an extend although not at optimum.

According to the teaching incarnated in the instant (fourth) embodiment, the minimum cut procedure or algorithm is adopted as the heuristic procedure for the initial element placement. Since the element placement setting by the minimum cut method is fully described in the literature mentioned hereinbefore (i.e. the article by M.A. Berure), a brief description thereof will be sufficient for understanding the fourth embodiment of the inventive method.

In the first place, a cut line is defined on a LSI chip on which elements are placed at random, whereon the number of inter-element wiring conductors which traverse the cut line is determined. Subsequently, the element exchange is performed and the number of the inter-element wiring conductors traversing the cut line is determined. By determining the element placement so that the wiring conductor number is decreased, the initial placement is established.

The instant embodiment is advantageous in that convergence to the placement equivalent to or approximating to the optimum solution can be realized within a much reduced time because of the initial placement improved at least to some extent.

Figure 9:
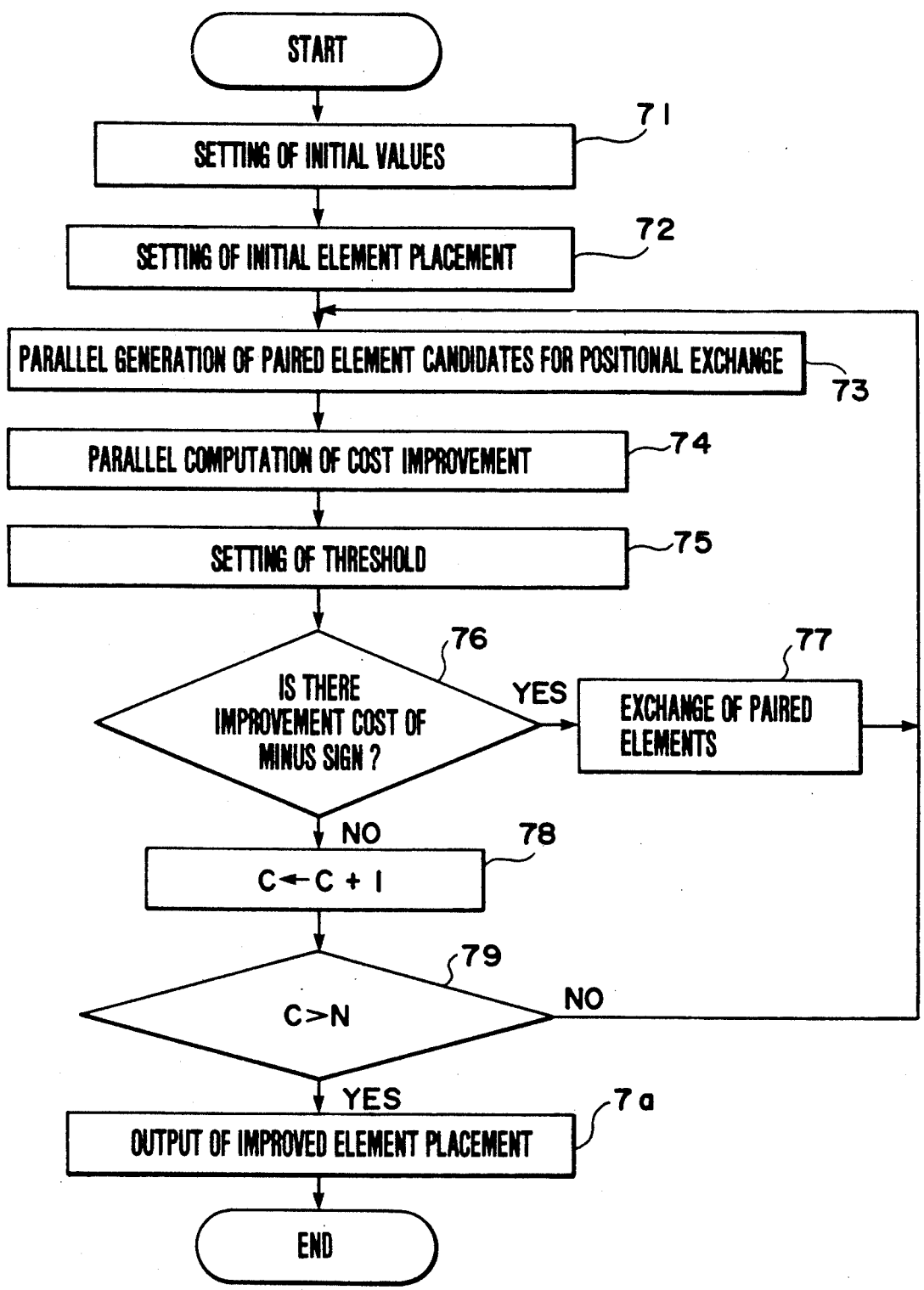
FIG. 9 is a flow chart for illustrating a computation procedure for the element placement optimizing method according to a fifth embodiment of the invention.

FIG. 9 is a flow chart showing a computation procedure for the element placement optimizing method according to a fifth embodiment of the invention. The embodiment differs from the first one in that a threshold value setting step 75 is provided and that any one of element pairs which are susceptible to the cost improvement over the threshold rather than that susceptible to the highest cost improvement or reduction is selected for the positional exchange at step 77. At the threshold value setting step 75, the number Ml of those of the cost improvement values determined at the step 74 which are of minus sign is determined, whereon the threshold value 8 is arithmetically determined by the control CPU, for example, in accordance with the following expression:

$$\theta = \begin{cases} M; & M1 \geq M/2 \\ M1(1 + M1/M; & M1 < M/2 \end{cases}$$

where M represents the number of the pairs selected at step 73 (or the number of the CPUs used for this processing in the parallel computer system).

At step 77, all the pairs susceptible to the cost improvement over the threshold or a given one of them is exchanged in respect to the position in the placement. The instant embodiment can also enjoy the advantageous effects similar to those of the first embodiment.

Figure 10:
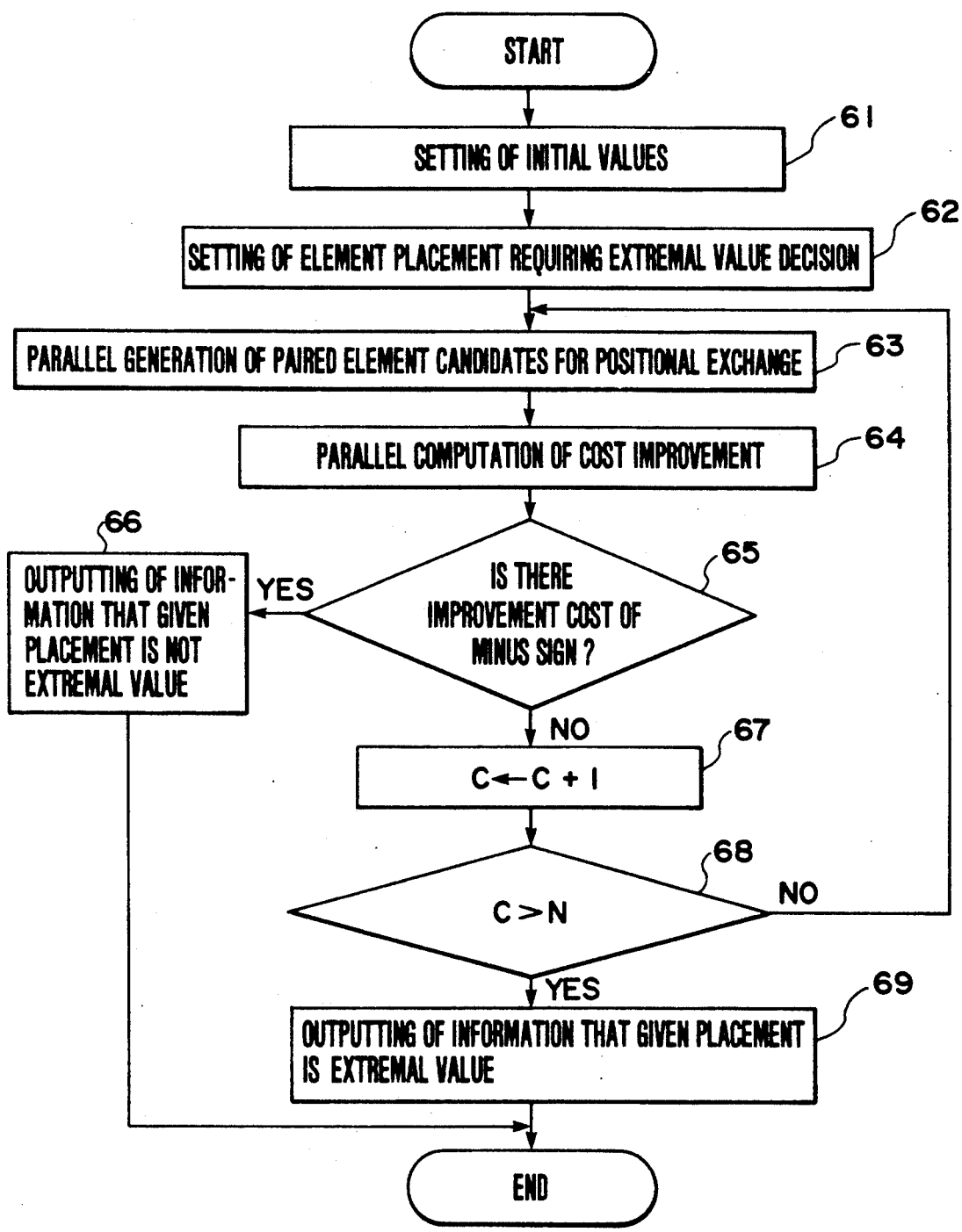
FIG. 10 is a flow chart for illustrating a decision procedure for the optimal placement deciding method according to a first embodiment of the invention.

FIG. 10 is a flow chart for illustrating a decision procedure in an optimal placement deciding method according to a further embodiment of the invention.

Referring to the figure, the predetermined repetition number N and the number M of the CPUs are set at step 61, which is followed by step 62 where an element placement for which an extremal value decision (local optimum value decision) is to be performed is set.

Steps 63, 64 and 65 are similar to the step 33, 34 and 35, respectively, which have been described hereinbefore in conjunction with the first embodiment. If the presence of any element pair which is susceptible to the cost improvement is determined at step 65, the processing proceeds to step 66 where information that the element placement of concern is not the local optimal value is outputted, whereupon the processing comes to an end.

When it is decided at the step 65 that all of M pairs include none of the element pairs which can assure the cost improvement, the content of the counter C is incremented by "1" (step 67). At step 68, the content of the counter C is compared with the preset value N. If the condition C>N is not satisfied, step 63 is regained, otherwise the processing proceeds to step 69 where the information indicating that the element placement set at the step 62 can assure the local optimal value is outputted, whereupon the processing comes to an end. In other words, when the processing resulting in that none of the M pairs is insusceptible to the cost improvement is repeated (N+1) times, it is then decided that the element placement of concern can assure the local optimal solution.

Figure 11:
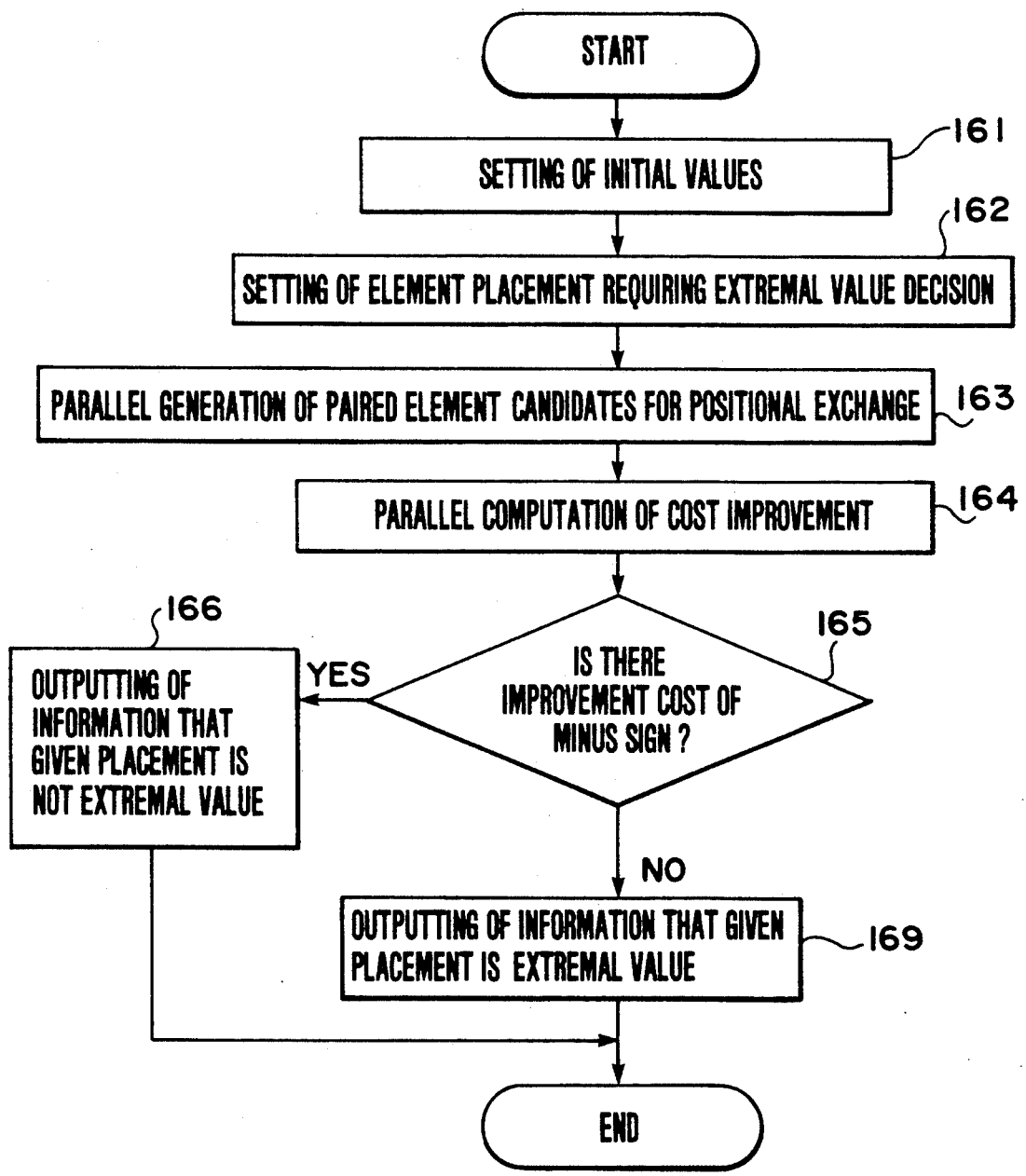
FIG. 11 is a flow chart for illustrating the optimal placement deciding method according to second embodiment of the invention.

FIG. 11 is a flow chart for illustrating a second embodiment of the optimal element placement deciding method according to the invention. The instant embodiment is basically similar to the preceding embodiment described just above by reference to FIG. 10, wherein steps 161, 162, 163, 164, 165, 166 and 169 shown in FIG. 11 correspond, respectively, to those denoted by 61, 62, 63, 64, 65, 66, and 69 in FIG. 10. Difference of the instant embodiment from the proceeding one can be seen in that while the computation for determining the element pairs susceptible to the cost improvement is repeated for the preset number N in the case of the preceding embodiment, decision is made to the effect that the element placement of concern is not optimal if there is found any paired element candidates which can bring about the cost improvement in the case of the instant embodiment.

Figure 12:
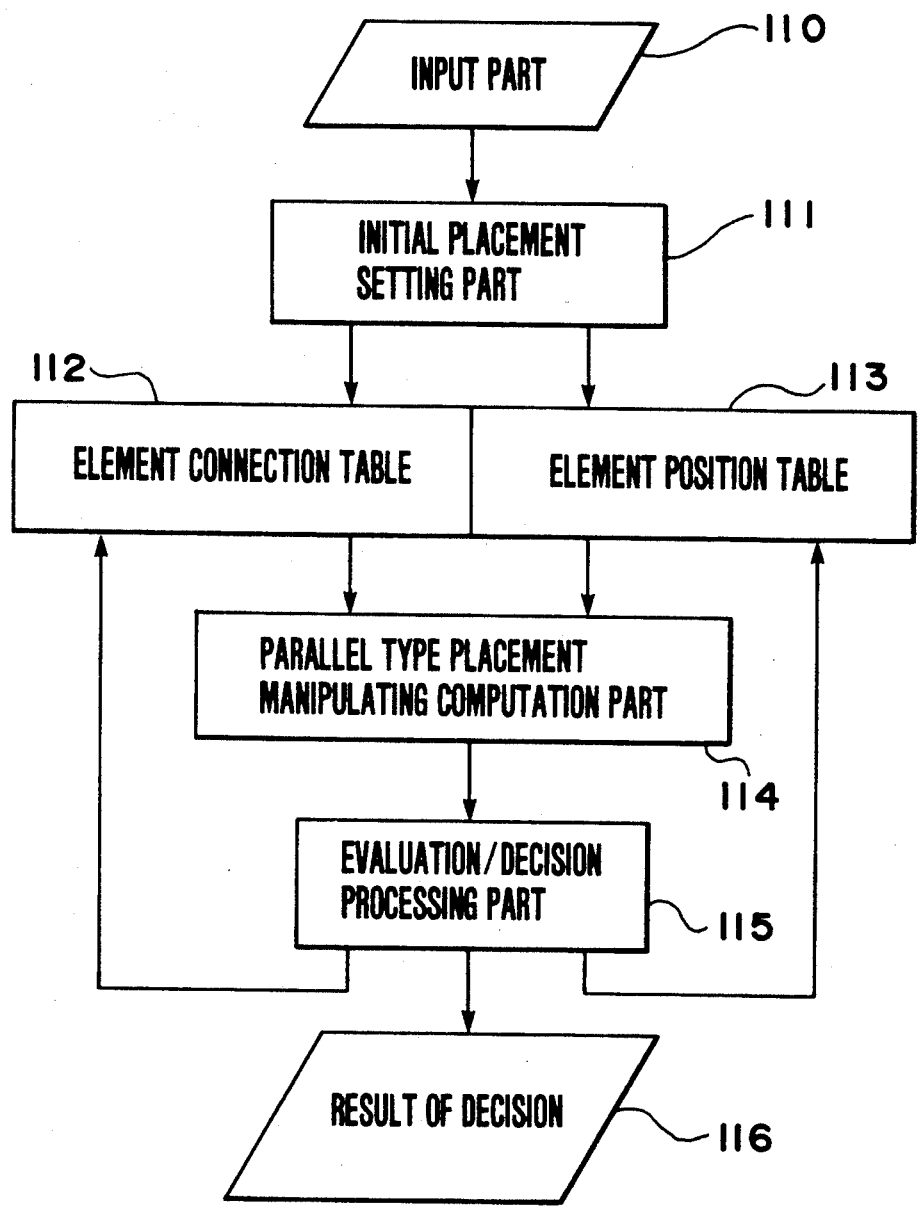
FIG. 12 is a block diagram showing a general placement of the optimal placement deciding apparatus according to an exemplary embodiment of the invention.
Figure 13:
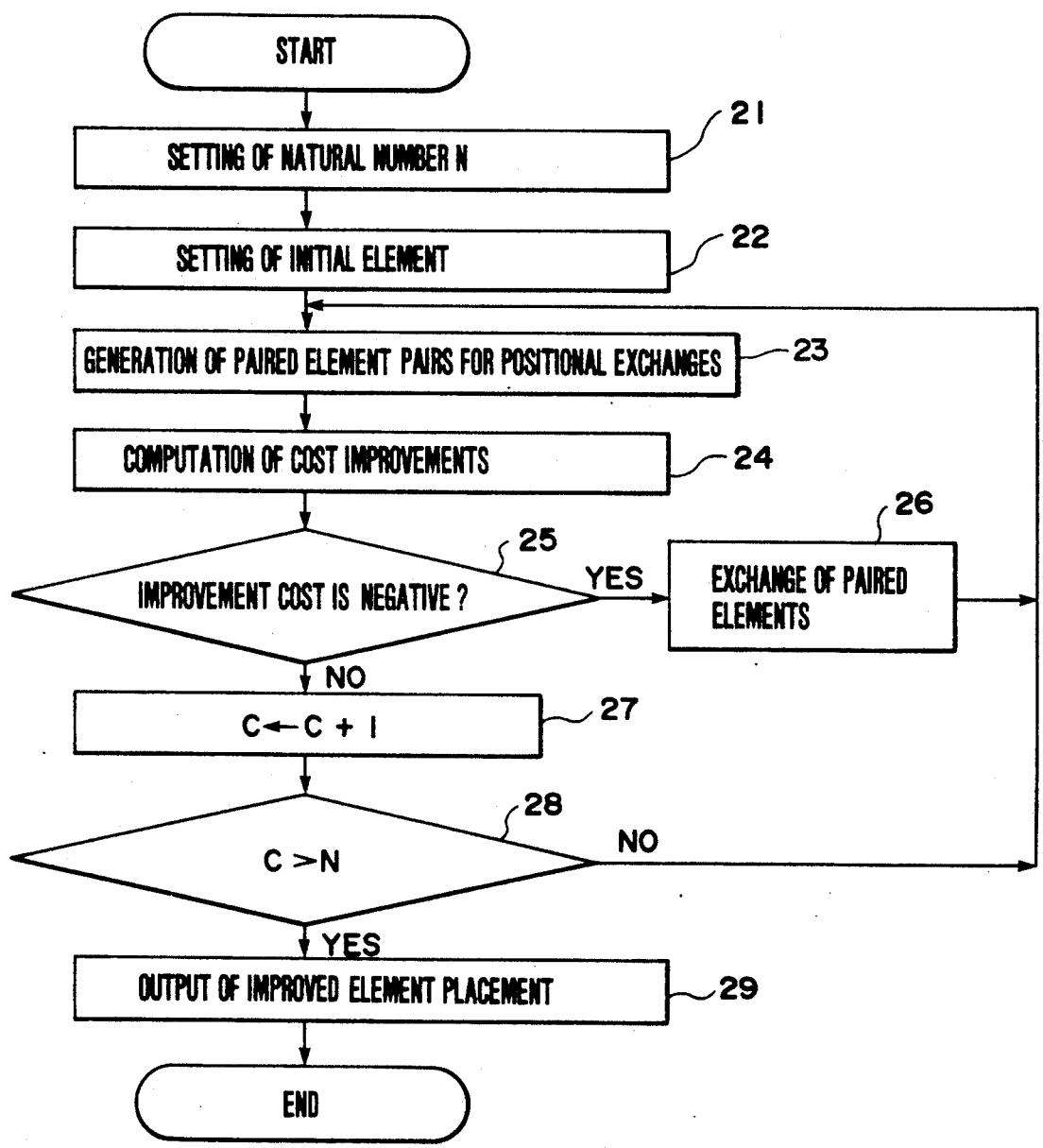
FIG. 13 is a flow chart of illustrating a repetitive improving method known heretofore.

FIG. 12 is a block diagram showing a general placement of an optimal element placement deciding apparatus for making decision as to whether or not a predetermined placement of numerous elements which correlate to one another is optimal by using a parallel processing type computer system which includes a plurality of CPUs. The apparatus shown in FIG. 12 has a structure closely similar to that of the apparatus shown in FIG. 1. In the case of the latter, information concerning the wiring relations and the positional relations among the elements in the optimal placement is outputted from the evaluation/decision processing part 15. In contrast, in the case of the apparatus shown in FIG. 12, the result of decision concerning whether or not a given element placement exhibits the local optimal value is outputted from the evaluation/decision processing part 115.

Parenthetically, the connection table 112, the placement table 113, the parallel processing type placement computation part 114 and the evaluation/decision part 115 are of substantially same structures as those shown in FIGS. 2, 3 and 4, and thus illustration and repeated description thereof will be unnecessary. According to the illustrated embodiment of the invention, decision can be made at a higher speed as to whether any given element placement exhibits the local optimal value. The processing speed can further be increased by adopting the multi-processor system with overhead being reduced.

While the invention has been shown and described in conjunction with particular embodiments, it is apparent that many and various modifications and changes can readily occur to those skilled in the art. By way of example, although the invention has been described in conjunction with the element placement on LSIs, the present invention is never restricted to such application but can be profitably employed for establishing the element placement on ICs or printed substrate or the like. Accordingly, it is intended that the present invention should cover all possible modifications and changes without departing from the spirit and scope of the invention.

We claim:

1. A method of optimizing an element placement including a number of elements which correlate to one another by exchanging appropriately positions of said elements with the aid of a parallel computer system including a plurality of central processing units (CPUs), the method comprising the steps of:

establishing the initial placement for a number of elements;

selecting a number of pairs of elements at random, said number being a number of said CPUs which are employed;

determining a value of cost improvement expected to be brought about by exchange of the paired elements for each of said pairs by said number of CPUs;

exchanging positions of the paired elements only for a pair in which the cost improvement value determined at said determining step is a maximum or exceeds a given threshold value;

executing repeatedly said selecting to said exchanging steps for a predetermined number of times; and outputting information indicating an optimal element placement of said elements by executing repeatedly said exchanging step while increasing the number of CPUs until a predetermined number of CPUs are employed.

2. An element placement optimizing method according to claim 1, wherein at said establishing step, the initial element placement is determined through a heuristic procedure or by using pseudo-random numbers.

3. A method of optimizing an element placement including a number of elements which correlate to one another by exchanging appropriately positions of said elements with the aid of a parallel computer system including a plurality of central processing units (CPUs), the method comprising the steps of:

establishing an initial placement for a number of elements;

establishing an upper limit of CPUs which can be employed;

selecting a number of pairs of elements at random, said number being a number of CPUs which are employed;

determining a value of cost improvement expected to be brought about by exchange of the paired elements for each of said pairs by said number of CPUs;

exchanging the positions of the paired elements only for a pair for which the cost improvement value determined at said determining step is a maximum or exceeds a given threshold value;

executing repeatedly said selecting to exchanging steps until the element pairs for which the cost improvement value can be obtained at said selecting step are no longer present; and outputting information indicating an optimal element placement of said elements obtained by executing repeatedly said executing step while increasing the number of CPUs until a number of an upper limit of CPUs are employed.

4. An element placement optimizing method according to claim 3, wherein at said establishing step, the initial element placement is determined through a heuristic procedure or by using pseudo-random numbers.

5. An element placement optimizing apparatus for determining optimum positions of elements, wherein a number of the elements correlate with one another, by exchanging appropriately the positions of the elements with the aid of a parallel processing computer system including a plurality of central processing units (CPUs), comprising:

initial placement setting means for establishing an initial element placement of a plurality of elements;

CPU upper limit number means for setting an upper limit number of CPUs which can be employed;

paired candidate selecting means for selecting at random a number of paired element candidates, said number of paired element candidates corresponding to the number of said CPUs which are employed for operation;

operation means for determining cost improvement values expected to be brought about by exchanging positions of the paired element candidates assigned to said CPUs, respectively;

element position exchanging means for exchanging the positions of the paired element candidates for which a cost improvement value determined by said operation means is a maximum or exceeds a given threshold value; and output means for outputting information indicating an optimum element placement of said elements, by executing repeatingly the operations of said paired candidate selecting means, said operation means and said element position exchanging means until it is determined that no more paired element candidates exist in which a cost thereof can be improved by exchanging the element positions when said upper limit number of the CPUs set at said CPU upper limit number setting means are used.

6. An element placement optimizing apparatus which comprises a parallel processing computer including a plurality of central processing units (CPUs) for determining an optimal element placement by appropriately exchanging positions of elements in an placement including a number of the elements, said apparatus comprising:

initial position setting means for setting initial positions of said elements;

first memory means for storing a connection table concerning said initial positions and inter-element interconnection relations in an placement after having been changed and an placement position table concerning placed positions of the individual elements;

second memory means for storing the results of operation;

third memory means for storing conditions for executing said operation and/or a threshold value;

paired candidate selection/determination means for allowing each of two or more CPUs to select a random the paried element candidates and determine arithmetically a cost improvement value obtained by exchanging the element positions for the selected paired candidates, the result of said arithmetic opertion being stored in said second memory means;

element position exchanging means for updating said connection table and said placed position table stored in said first memory means to the element positions for the paired candidates for which the cost improvement value is greatest among those stored in said second memory means or exceeds the threshold value stored in said third memory means;

execution repeating/outputting means for repeating executions by said paired candidate selection/-determination means and said element position exchanging means in accordance with the conditions stored in said third memory means and outputting the resulting placement as the optimum placement;

wherein the number of times said execution is repeated in case there exist no paired candidates for which the cost improvement value resulting from the operation of said paired candidates selection/-determination means is positive or exceeds said threshold value is placed in said third memory means, said execution repeating/outputting means outputting the placement resulting from said repetition of excecution for said predetermined number of times as the optimum element placement initial placement setting means for establishing an initial element placement;

wherein said third memory means is further provided with an upper limit number of the CPUs employed for execution by said paired candidate selection/-determination means, and a starting number of the CPUs employed at the time of starting the execution, wherein the number of the CPUs is increased in the course of the execution, wherein said execution is started with said starting number of the CPUs, the execution of said paired candidate selection/determination means is repeated for a predetermined number of times, being followed again by repetition of the execution of said paired candidate selection/determination means for said predetermined number of times with the number of CPUs increased in the course of the execution, and wherein said execution repeating/outputting means outputs as the optimal element placement the placement obtained when said upper limit number of the CPUs has been attained as the result of repeatedly increasing of the number of the CPUs.

7. An apparatus for optimizing an optimal element placement of a plurality of elements by exchanging appropriately positions of the elements, wherein the elements correlate to one another, said apparatus comprising:

initial placement setting means for establishing an initial placement of the elements;

paired candidates selecting means for selecting at random plural pairs of element candidates for exchange of positions;

operation means for determining a value of cost improvement expected to be brought about by exchange of positions for each of the paired element candidates by a number of CPUs;

element position exchanging means for exchanging element positions of the paired element candidates only for a pair which a cost improvement value determined by said operation means is a maximum or exceeds a given threshold value;

means for executging repeatedly a predetermined number of times operations of said paired candidate selecting means said operation means and said element position exchanging means; and outputting means for outputting information indicating an optimal element placement of said elements by executing repeatedly said element position exchanging means while increasing the number of CPUs until a predetermined number of CPUs are employed.

8. An apparatus for optimizing an optimal element placement of a plurality of elements by exchanging appropriately positions of the elements, wherein the elements correlate to one another, said apparatus comprising:

means for establishing an initial placement for a number of elements;

means for establishing an upper limit of CPUs which can be employed;

means for selecting a number of pairs of elements at random, said number being a number of CPUs which are employed;

means for determining a value of cost improvement expected to be brought about by exchange of paired elements for each of said pairs by said number of CPUs;

means for exchanging positions of paired elements only for a pair of which a cost improvement value determined by said means for determining is a maximum or exceeds a given threshold value;

means for executing repeatedly a predetermined number of times said means for selecting, said means for determining and said means for exchanging until element pairs for which a cost improvement value determined by said means for determining are no longer present; and means for outputting information indicating an optimal element placement of said elements obtained by executing repeatedly a predetermined number of times said means for exchanging while increasing the number of CPUs until a number of an upper limit of CPUs are employed.

* * * * *